(12) United States Patent
Sakai et al.

(10) Patent No.: US 8,746,856 B2
(45) Date of Patent: Jun. 10, 2014

(54) PIEZOELECTRIC ELEMENT, LIQUID EJECTING HEAD, AND LIQUID EJECTING APPARATUS

(75) Inventors: Tomohiro Sakai, Chino (JP); Koichi Morozumi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/451,095

(22) Filed: Apr. 19, 2012

(65) Prior Publication Data

US 2012/0268533 A1 Oct. 25, 2012

(30) Foreign Application Priority Data

Apr. 22, 2011 (JP) ................................. 2011-096599

(51) Int. Cl.
*B41J 2/045* (2006.01)

(52) U.S. Cl.
USPC ......................................................... 347/68

(58) Field of Classification Search
None
See application file for complete search history.

(56) References Cited

U.S. PATENT DOCUMENTS

| 8,212,451 | B2 | 7/2012 | Inagaki et al. |
| 2009/0243438 | A1 | 10/2009 | Hamada et al. |
| 2010/0231095 | A1 | 9/2010 | Kubota et al. |
| 2011/0226634 | A1* | 9/2011 | Bhavaraju ..................... 205/621 |

FOREIGN PATENT DOCUMENTS

| CN | 101536203 | | 9/2009 |
| EP | 2 262 020 | | 12/2010 |
| JP | 11145412 | A * | 5/1999 |
| JP | 2001-223404 | | 8/2001 |
| JP | 2009-252789 | | 10/2009 |
| JP | 2009252789 | A * | 10/2009 |
| WO | 2010/013438 | | 2/2010 |

OTHER PUBLICATIONS

European Search Report for European Patent Application No. 12164994.1 dated Mar. 25, 2014.

\* cited by examiner

*Primary Examiner* — Matthew Luu
*Assistant Examiner* — Erica Lin
(74) *Attorney, Agent, or Firm* — Workman Nydegger

(57) ABSTRACT

A piezoelectric element comprises a first electrode including platinum, a piezoelectric layer disposed above the first electrode, made of a complex oxide having a perovskite structure containing at least bismuth, and a second electrode disposed above the piezoelectric layer. An oxide containing bismuth and platinum is disposed at the interface of the piezoelectric layer with the first electrode.

6 Claims, 13 Drawing Sheets 0.2 μm 100 nm

PIEZOELECTRIC ELEMENT, LIQUID EJECTING HEAD, AND LIQUID EJECTING APPARATUS

CROSS-REFERENCE TO RELATED APPLICATIONS

The entire disclosure of Japanese Patent Application No. 2011-096599, filed Apr. 22, 2011 is expressly incorporated by reference.

BACKGROUND

1. Technical Field

The present invention relates to a liquid ejecting head and a liquid ejecting apparatus, each including a pressure generating chamber communicating with a nozzle aperture and a piezoelectric element that includes a piezoelectric layer and electrodes applying a voltage to the piezoelectric layer and functions to change the pressure in the pressure generating chamber, and relates to the piezoelectric element.

2. Related Art

Some of the piezoelectric elements used in liquid ejecting heads have a structure in which a piezoelectric layer made of a piezoelectric material capable of electromechanical conversion, such as a crystallized dielectric material, is disposed between two electrodes. This type of piezoelectric element can be used as a deflection vibration mode actuator device in a liquid ejecting head. Ink jet recording heads are a typical type of liquid ejecting head. An ink jet recording head includes a vibration plate defining a part of a pressure generating chamber communicating with nozzle apertures through which ink droplets are ejected. In the ink jet recording head, a piezoelectric element deforms the vibration plate to apply a pressure to the ink in the pressure generating chamber, thereby ejecting ink droplets through the nozzle apertures.

The piezoelectric ceramic film of the piezoelectric element is required to have high piezoelectric properties, and a typical example of the piezoelectric material is lead zirconate titanate (PZT) (see JP-A-2001-223404). However, lead zirconate titanate contains lead. From the viewpoint of environmental protection, lead-free piezoelectric materials are desired. Accordingly, piezoelectric materials have been developed which do not contain lead, but have piezoelectric properties equal to PZT. For example, piezoelectric materials having a bismuth ferrate ($BiFeO_3$)-based perovskite structure containing bismuth and iron have been proposed. For example, JP-A-2009-252789 discloses a complex oxide expressed as a mixed crystal of bismuth ferrate manganate such as $Bi(Fe, Mn)O_3$ and barium titanate such as $BaTiO_3$.

However, bismuth ferrate-based piezoelectric materials are liable to crack during the production and after a certain time has elapsed from the production.

This issue arises not only in ink jet recording heads, but also in other liquid ejecting heads that eject droplets other than ink, and piezoelectric elements used for applications other than liquid ejecting heads have the same issue.

SUMMARY

An advantage of some aspects of the invention is that it provides a liquid ejecting head and a liquid ejecting apparatus that have low environmental load and in which the occurrence of cracks is suppressed, and provides a piezoelectric element used in the liquid ejecting head and the liquid ejecting apparatus.

According to an aspect of the invention, a liquid ejecting head is provided which includes a pressure generating chamber communicating with a nozzle aperture, and a piezoelectric element. The piezoelectric element includes a first electrode made of platinum, a piezoelectric layer on the first electrode, made of a complex oxide having a perovskite structure containing at least bismuth, and a second electrode on the piezoelectric layer. In addition, an oxide containing bismuth and platinum is disposed at the interface of the piezoelectric layer with the first electrode.

In this embodiment, the portion of the oxide containing bismuth and platinum contributes to reducing the occurrence of cracks in the piezoelectric layer made of a bismuth based- piezoelectric material In addition, since the lead content can be reduced, the environmental load can be reduced.

Preferably, the piezoelectric layer may further contain iron. More preferably, the piezoelectric layer may further contain manganese and titanium.

Preferably, the oxide containing bismuth and platinum is made of bismuth platinate having a pyrochlore structure. Thus, cracks in the piezoelectric layer made of a bismuth-based piezoelectric material can be reliably suppressed.

Preferably, the oxide containing bismuth and platinum is disposed in an island manner. Thus, the adhesion between the oxide and the piezoelectric layer is enhanced.

According to another aspect of the invention, a liquid ejection apparatus including the above-described liquid ejection head is provided. Since the liquid ejecting apparatus includes the piezoelectric element whose environmental load is reduced and in which the occurrence of cracks is suppressed, the liquid ejecting apparatus can be reliable.

According to another aspect of the invention, a piezoelectric element is provided which includes a first electrode made of platinum, a piezoelectric layer on the first electrode, made of a complex oxide having a perovskite structure containing at least bismuth, and a second electrode on the piezoelectric layer. In addition, an oxide containing bismuth and platinum is disposed at the interface of the piezoelectric layer with the first electrode.

In the piezoelectric element of this embodiment, cracks in the piezoelectric layer made of a bismuth-based piezoelectric material are suppressed. In addition, since the lead content can be reduced, the environmental load can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
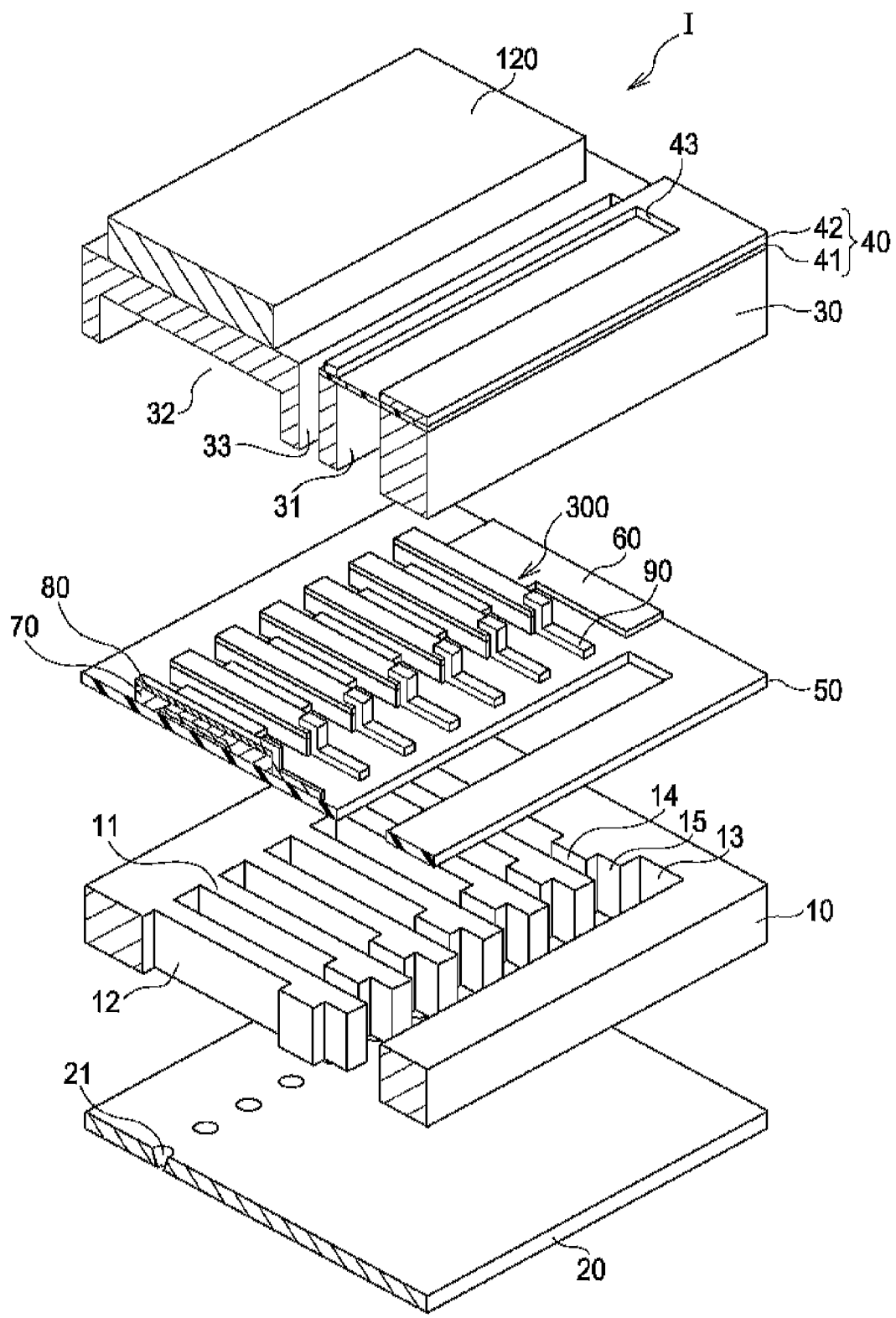
FIG. 1 is a schematic exploded perspective view of a recording head according to an embodiment of the invention.
Figure 2:
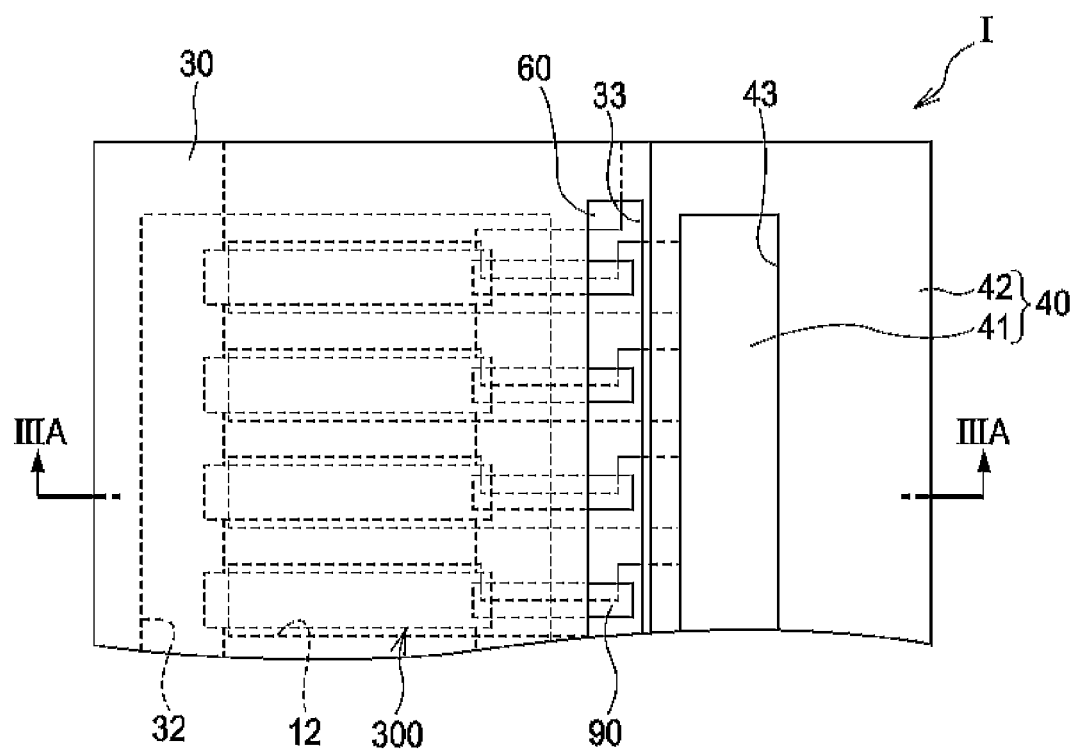
FIG. 2 is a plan view of the recording head according to the embodiment.
Figure 3A:
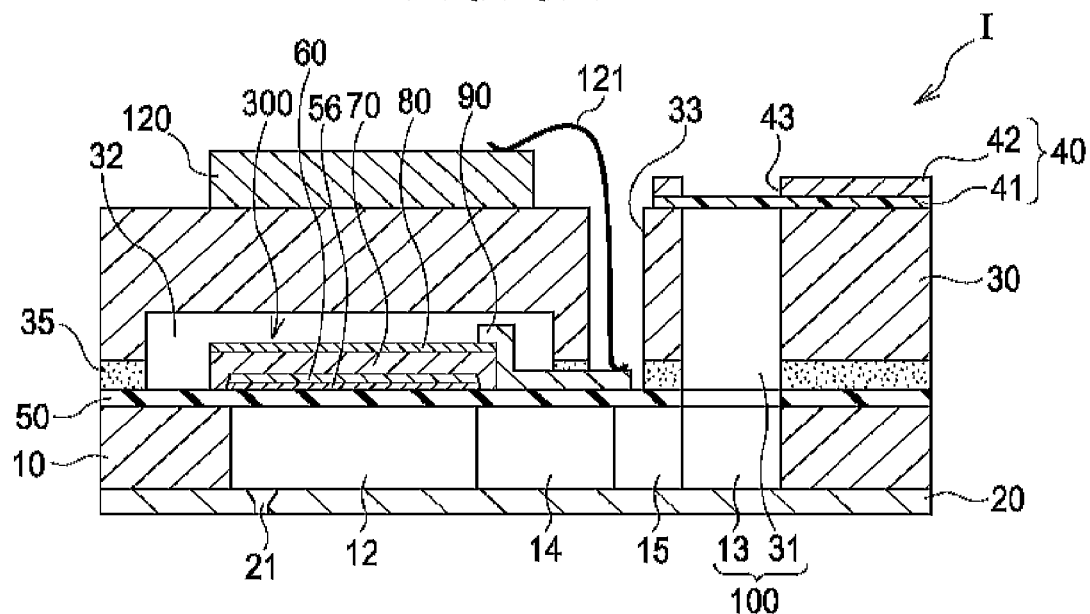
FIG. 3A is a sectional view of the recording head according to the embodiment.
Figure 3B:
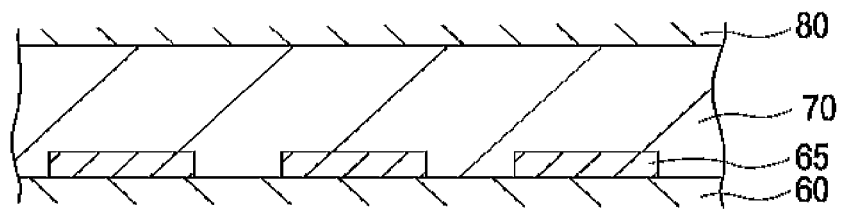
FIG. 3B is an enlarged sectional view of a major portion of the recording head shown in FIG. 3A.
Figure 3C:
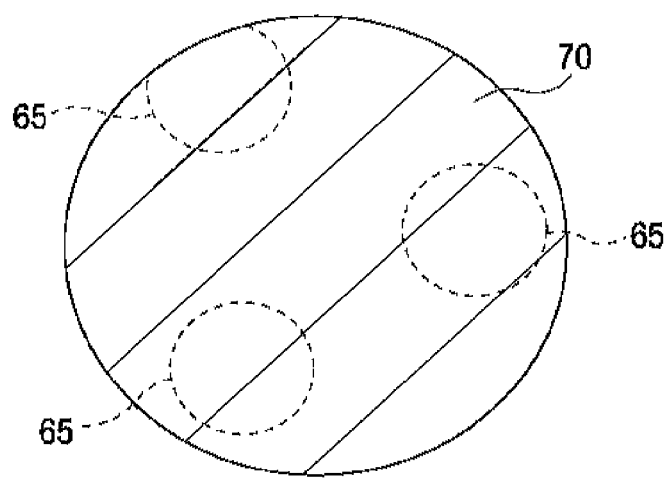
FIG. 3C is an enlarged plan view of the major portion.

FIG. 1 is an exploded perspective view of an ink jet recording head, which is a type of liquid ejecting head, according to an embodiment of the invention. FIG. 2 is a plan view of the ink jet recording head shown in FIG. 1. FIG. 3A is the sectional view taken along line IIIA-IIIA in FIG. 2, FIG. 3B is an enlarged sectional view of a major portion of the structure shown in FIG. 3A, and FIG. 3C is an enlarged plan view of the major portion viewed from the second electrode side.

As shown in these figures, a flow channel substrate 10 is made of a (110) plane-oriented monocrystalline silicon, and a silicon dioxide elastic film 50 having a thickness of 0.5 to 2 µm is disposed on one surface of the flow channel substrate 10. The elastic film 50 forms a vibration plate.

The flow channel substrate 10 has pressure generating chambers 12 that have been formed by anisotropic etching performed from the side of the other surface of the flow channel substrate 10. The pressure generating chambers 12 are separated by a plurality of partition members 11 and are arranged in parallel in the direction of the alignment of the nozzle apertures 21 from which the same color ink is ejected. This direction is hereinafter referred to as pressure generating chamber parallel arrangement direction or first direction, and the direction perpendicular to the first direction is referred to as second direction. At one end of the pressure generating chambers 12 in the second direction, ink supply channels 14 and communication paths 15 each separated by the partition members 11 are formed. A communicating section 13 is formed at one end of the communication paths 15. The communicating section 13 defines part of a manifold 100 that acts as a common ink chamber (liquid chamber) of the pressure generating chambers 12. Thus, the flow channel substrate 10 has liquid flow channels including the pressure generating chambers 12, the ink supply channels 14, the communication paths 15 and the communicating section 13.

Each ink supply channel 14 communicates with one end in the second direction of the corresponding pressure generating chamber 12 and has a smaller section than the pressure generating chamber 12. For example, in the present embodiment, the widths of the flow channels between the manifold 100 and the pressure generating chambers 12 are reduced on the pressure generating chamber 12 side so that the ink supply channels 14 have a smaller width than the pressure generating chambers 12. Although the ink supply channels 14 are thus formed by narrowing the flow channels from one side in the present embodiment, the flow channels may be narrowed from both sides in another embodiment. Alternatively, the ink supply channels 14 may be formed by reducing the depth of the flow channels, instead of narrowing the flow channels. Each communication path 15 communicates with the end of the ink supply channel 14 opposite to the pressure generating chamber 12, and has a larger cross section (in the width (first) direction) than the ink supply channel 14. In the present embodiment, the communication path 15 has the same cross section as the pressure generating chamber 12.

The flow channel substrate 10 is joined to a nozzle plate 20 at the open side thereof with an adhesive, a thermal fusion film or the like. The nozzle plate 20 has nozzle apertures 21 communicating with portions around the ends of the corresponding pressure generating chambers 12 opposite to the ink supply channels 14. The nozzle plate 20 can be made of, for example, glass-ceramic, monocrystalline silicon or stainless steel.

On the opposite side to the open side of the flow channel substrate 10, the above-mentioned elastic film 50 is disposed, and an adhesion layer 56 having a thickness of, for example, about 30 to 50 nm and made of titanium oxide or the like is disposed on the elastic film 50 to enhance the adhesion between the elastic film 50 and the overlying first electrode 60, as shown in FIG. 3A. The elastic film 50 may be provided thereon with an insulating film made of zirconium oxide or the like, if necessary.

Furthermore, piezoelectric elements 300 are disposed on the adhesion layer 56. Each piezoelectric element 300 has a multilayer structure including a first electrode 60 made of platinum, a piezoelectric layer 70 having a small thickness of 3 µm or less, preferably 0.3 to 1.5 µm, on the upper side of the first electrode 60, and a second electrode 80 on the upper side of the piezoelectric layer 70. The phrase "on the upper side" of something mentioned herein means that it may be directly disposed on something or disposed with another member therebetween. The piezoelectric element 300 mentioned herein refers to the portion including the first electrode 60, the piezoelectric layer 70 and the second electrode 80. In general, one of the electrodes of the piezoelectric element 300 acts as a common electrode, and the other electrode and the piezoelectric layer 70 are formed for each pressure generating chamber 12 by patterning. Although in the present embodiment, the first electrode 60 acts as the common electrode of the piezoelectric elements 300 and the second electrode 80 is provided as discrete electrodes of the piezoelectric elements 300, the functions of the first and second electrodes may be reversed for the sake of convenience of arrangement of the driving circuit and wiring. In the present embodiment, the piezoelectric element 300 disposed in a displaceable manner refers to an actuator device. Although in the structure shown in FIG. 1, the elastic film 50, the adhesion layer 56 and the first electrode 60 constitute the vibration plate, the vibration plate is not limited to this structure. For example, only the first electrode 60 may act as the vibration plate without using the elastic film 50 or the adhesion layer 56. The piezoelectric element 300 may double as a vibration plate.

The piezoelectric material of the piezoelectric layer 70 is a complex oxide having a perovskite structure containing bismuth (Bi), such as a bismuth ferrate-based complex oxide or a bismuth titanate-based complex oxide. Exemplary bismuth ferrate-based complex oxides include bismuth ferrate ($BiFeO_3$). bismuth ferrate aluminate ($Bi(Fe, Al)O_3$), bismuth ferrate manganate ($Bi(Fe, Mn)O_3$), bismuth lanthanum ferrate manganate ((Bi, La)(Fe, Mn)O$_3$), bismuth barium ferrate manganate titanate ((Bi, Ba)(Fe, Mn, Ti)O$_3$), bismuth ferrate cobaltate (Bi(Fe, Co)O$_3$), bismuth cerium ferrate (Bi, Ce)FeO$_3$), bismuth cerium ferrate manganate ((Bi, Ce)(Fe, Mn)O$_3$), bismuth lanthanum cerium ferrate ((Bi, La, Ce)FeO$_3$), bismuth lanthanum cerium ferrate manganate ((Bi, La, Ce) (Fe, Mn)O$_3$), bismuth samarium ferrate ((Bi, Sm)FeO$_3$), bismuth barium ferrate manganate titanate ((Bi, Ba)(Fe, Mn, Ti)O$_3$), bismuth ferrate chromate (Bi(Cr, Fe)O$_3$), bismuth potassium ferrate manganate titanate ((Bi, K)(Fe, Mn, Ti)O$_3$), and bismuth barium ferrate manganate zincate titanate ((Bi, Ba)(Fe, Mn, Zn, Ti)O$_3$). Exemplary bismuth titanate-based complex oxides include bismuth sodium potassium titanate ((Bi, Na, K)TiO$_3$), bismuth barium sodium titanate zincate ((Bi, Na, Ba)(Zn, Ti)O$_3$), and bismuth barium sodium titanate cuprate ((Bi, Na, Ba) (Cu, Ti)O$_3$). Also, bismuth potassium titanate ((Bi, K)TiO$_3$), bismuth chromate (BiCrO$_3$) and other ceramics may be used. Bi(Zn$_{1/2}$Ti$_{1/2}$)O$_3$, (Bi$_{1/2}$K$_{1/2}$)TiO$_3$, (Bi$_{1/2}$Na$_{1/2}$)TiO$_3$, (Li, Na, K) (Ta, Nb) O$_3$, or the like may be added to those complex oxides.

In the present embodiment, the piezoelectric layer 70 is made of a complex oxide having a perovskite structure expressed as bismuth barium ferrate manganate titanate ((Bi, Ba) (Fe, Mn, Ti)O$_3$), or a mixed crystal of bismuth ferrate manganate and barium titanate. This complex oxide is a single crystal (mixed crystal) of uniformly mixed solid solutions of bismuth ferrate manganate and barium titanate. The A site of the perovskite structure expressed by ABO$_3$ has 12 oxygen ligands, and the B site has 6 oxygen ligands to form an octahedron. Bi and Ba are present in the A site, and Fe, Mn and Ti are present in the B site.

Preferably, the complex oxide having a perovskite structure containing bismuth, barium, iron, manganese and titanium has a composition expressed by the following general formula (I). However, since general formula (I) represents a composition according to the stoichiometry, unavoidable deviation from the stoichiometric composition, resulting from elemental diffusion, lattice mismatch, deficient oxygen or the like is acceptable.

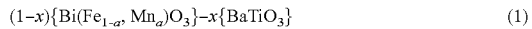

$$(1-x)\{Bi(Fe_{1-a}, Mn_a)O_3\}-x\{BaTiO_3\} \qquad (1)$$

where $0.1 \leq x \leq 0.4$ and $0.01 \leq a \leq 0.1$

In the present embodiment, an oxide containing bismuth and platinum is present at the interface of the piezoelectric layer 70 with the first electrode 60, as shown in FIG. 3B. In other words, oxide portions 65 made of an oxide containing bismuth and platinum are disposed between the piezoelectric layer 70 and the first electrode 60. The oxide containing bismuth and platinum is hereinafter referred to as oxide portion(s) 65.

The oxide portions 65 are made of an oxide containing bismuth and platinum, such as bismuth platinate having a pyrochlore structure. Bismuth platinate may be Bi$_2$Pt$_2$O$_7$, and the valences of its elements may be varied to form a different chemical formula from Bi$_2$Pt$_2$O$_7$. The oxide containing bismuth and platinum may have a pyrochlore structure, and part of bismuth or platinum may be substituted with other elements.

By forming the oxide portions 65 at the interface of the piezoelectric layer 70 made of a complex oxide having a bismuth-based perovskite structure with the first electrode 60 made of platinum, the occurrence of cracks in the piezoelectric layer 70 can be reduced. Although the piezoelectric layer 70 made of a bismuth-based piezoelectric material is liable to crack during the production and after a certain time has elapsed from the production, the occurrence of such cracks can be reduced by providing the oxide portion 65. Details will be described later.

The oxide portion 65 made of an oxide containing bismuth and platinum is electrically conductive and can function as an electrode. Accordingly, the oxide portion 65 does not reduce the voltage applied to the piezoelectric layer 70, and the same voltage as in the case of the structure not having the oxide portion 65 can be applied to the piezoelectric layer 70.

Also, since the piezoelectric material of the piezoelectric layer 70 and the oxide containing bismuth and platinum of the oxide portion 65 are both oxides and contain bismuth, the piezoelectric layer 70 and the oxide portion 65 can adhere tightly with each other. In addition, since the platinum first electrode 60 and the oxide portion 65 made of an oxide containing bismuth and platinum both contain platinum, the first electrode 60 and the oxide portion 65 can adhere tightly with each other.

It is not limited how the oxide portion 65 is provided, and it may be formed over the entire interface of the piezoelectric layer 70 with the first electrode 60. Preferably, the oxide portion 65 is formed in an island manner, as shown in FIG. 3B. An island manner refers to a state where the oxide portion 65 is provided so as not to cover the entire interface between the piezoelectric layer 70 and the first electrode 60, and, preferably, a plurality of oxide portions 65 are disposed at intervals. By providing the oxide portions 65 in an island manner, a rough interface is formed between the oxide portions 65 and the piezoelectric layer 70, so that the adhesion between the oxide portions 65 and the piezoelectric layer 70 is enhanced. The shape of the oxide portion 65 is not particularly limited, and may be circular or oval as shown in FIG. 3C when viewed from the second electrode 80 side.

The second electrode 80 provided for each piezoelectric element 300 is connected with a lead electrode 90 made of, for example, gold (Au) extending from the end of the second electrode 80 on the ink supply channel 14 side to the upper surface of the elastic film 50 and, optionally, to the upper surface of an insulating film.

A protective substrate 30 having a manifold section 31 defining at least part of a manifold 100 is joined to the flow channel substrate 10 having the piezoelectric elements 300 with an adhesive 35 so as to cover the first electrode 60, the elastic film 50, an optionally provided insulating film, and the lead electrodes 90. The manifold section 31 passes through the thickness of the protective substrate 30 and extends along the widths of the pressure generating chambers 12. Thus, the manifold section 31 communicates with the communicating section 13 of the flow channel substrate 10 to form the manifold 100 acting as the common ink chamber of the pressure generating chambers 12. The communicating section 13 of the flow channel substrate 10 may be divided for each pressure generating chamber 12, and only the manifold section 31 may serve as the manifold. Alternatively, the flow channel substrate 10 may have only the pressure generating chambers 12, and the manifold 100 and ink supply channels 14 communicating with the respective pressure generating chambers 12 are formed in a member between the flow channel substrate 10 and the protective substrate 30, such as the elastic film 50 and an optionally provided insulating film.

A piezoelectric element-protecting section 32 is disposed in the region of the protective substrate 30 opposing the piezoelectric elements 300. The Piezoelectric element-protecting section 32 has a space so that the piezoelectric elements 300 can operate without interference. It is intended that the space of the piezoelectric element-protecting section 32 is such a size that the piezoelectric elements 300 can operate, and may or may not be sealed.

Preferably, the protective substrate 30 is made of a material having substantially the same thermal expansion coefficient as the flow channel substrate 10, such as glass or ceramic. In the present embodiment, the protective substrate 30 is made of the same monocrystalline silicon as the flow channel substrate 10.

The protective substrate 30 has a through hole 33 passing through the thickness of the protective substrate 30. The ends of the lead electrodes 90 extending from the piezoelectric elements 300 are exposed in the through hole 33.

A driving circuit 120 is secured on the protective substrate 30 and drives the piezoelectric elements 300 arranged in parallel. The driving circuit 120 may be a circuit board, a semiconductor integrated circuit (IC) or the like. The driving circuit 120 is electrically connected to each lead electrode 90 with a conductive connection wire 121, such as bonding wire.

Furthermore, a compliance substrate 40 including a sealing film 41 and a fixing plate 42 is joined on the protective substrate 30. The sealing film 41 is made of a flexible material having a low rigidity, and seals one end of the manifold section 31. The fixing plate 42 is made of a relatively hard material. The portion of the fixing plate 42 opposing the manifold 100 is completely removed to form an opening 43; hence the manifold 100 is closed at one end only with the flexible sealing film 41.

The ink jet recording head I of the present embodiment draws an ink through an ink inlet connected to an external ink supply unit (not shown). The ink is delivered to fill the spaces from the manifold 100 to the nozzle apertures 21. Then, the ink jet recording head I applies a voltage between the first electrode 60 and each second electrode 80 corresponding to the pressure generating chambers 12, according to the recording signal from the driving circuit 120. Thus, the elastic film 50, the first electrode 60 and the piezoelectric layers 70 are deformed to increase the internal pressure in the pressure generating chambers 12, thereby ejecting the ink through the nozzle apertures 21.

A method for manufacturing the ink jet recording head according to the present embodiment will be described with reference to FIGS. 4A to 8B. FIGS. 4A to 8B are sectional views of the pressure generating chamber taken in the longitudinal direction.

Figure 4A:
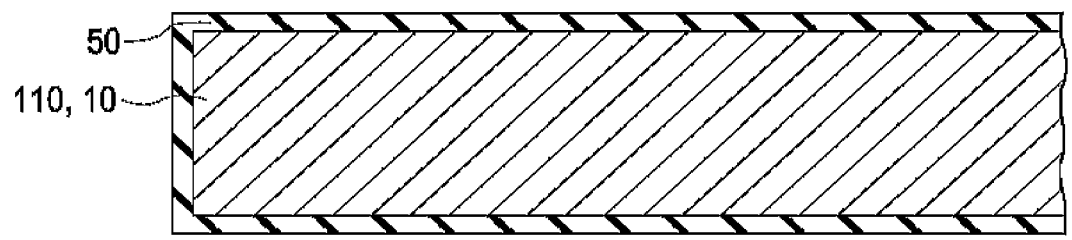
FIGS. 4A and 4B are sectional views showing a manufacturing process of the recording head according to the embodiment.
Figure 4B:
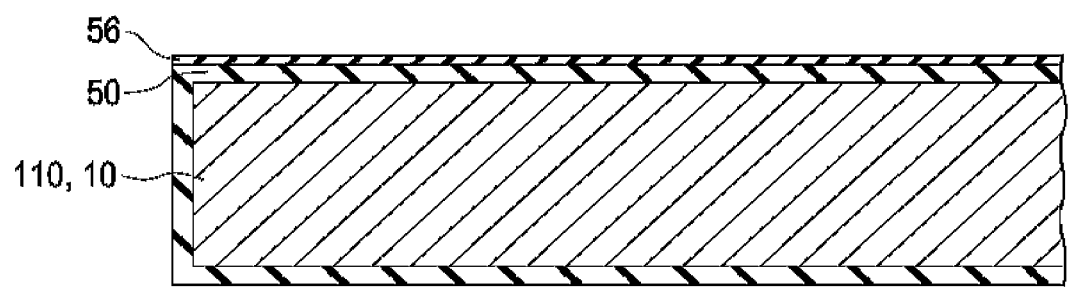

As shown in FIG. 4A, a silicon dioxide ($SiO_2$) film is formed for an elastic film 50 on the surface of a flow channel substrate silicon wafer 110 by thermal oxidation or the like. Then, an adhesion layer 56 is formed of, for example, titanium oxide on the $SiO_2$ elastic film 50 by sputtering, thermal oxidation or the like, as shown in FIG. 4B.

Figure 5A:
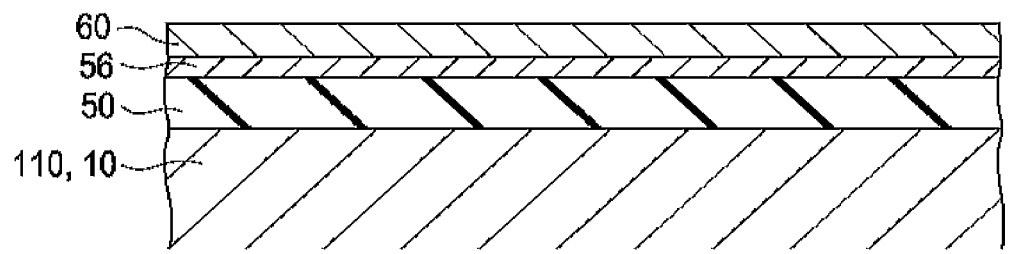
FIGS. 5A to 5C are sectional views showing the manufacturing process of the recording head according to the embodiment.
Figure 5B:
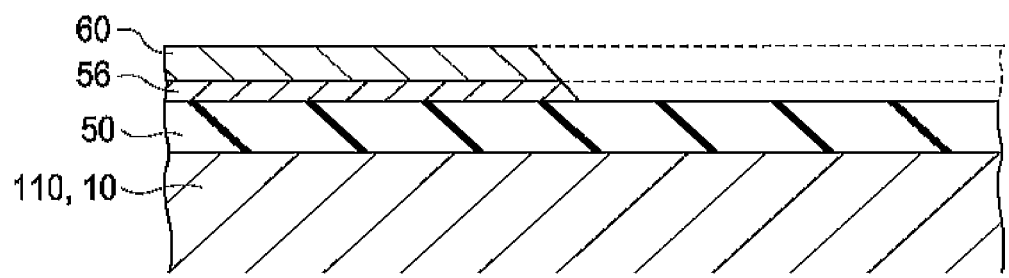

Subsequently, a first electrode 60 is formed over the entire surface of the adhesion layer 56, as shown in FIG. 5A. More specifically, a platinum first electrode 60 is formed on the adhesion layer 56 by sputtering or vapor deposition. Then, the first electrode 60 and the adhesion layer 56 are simultaneously patterned so that their sides are inclined, through a resist mask (not shown) having a predetermined shape on the first electrode, as shown in FIG. 5B.

Then, after removing the resist mask, an oxide portion 65 and piezoelectric layers 70 are formed on the first electrode 60 (and the adhesion layer 56). The piezoelectric layer 70 may be formed by any method without particular limitation. For example, a chemical solution method may be applied, such as a sol-gel method or a metal-organic decomposition (MOD) method in which a solution of metal complexes each contain-ing Bi, Fe, Mn, Ti or Ba dissolved or dispersed in a solvent is applied onto the first electrode 60, and the coating of the solution is dried and then fired to form a metal oxide piezoelectric layer (piezoelectric film). The piezoelectric layer 70 can be formed by other methods, such as sputtering, pulsed laser deposition (PLD), CVD or aerosol deposition, irrespective of liquid process or solid process.

The method for forming the oxide portion 65 is not particularly limited as well, and the oxide portion 65 may be formed by, for example, sputtering or PLD.

Figure 5C:
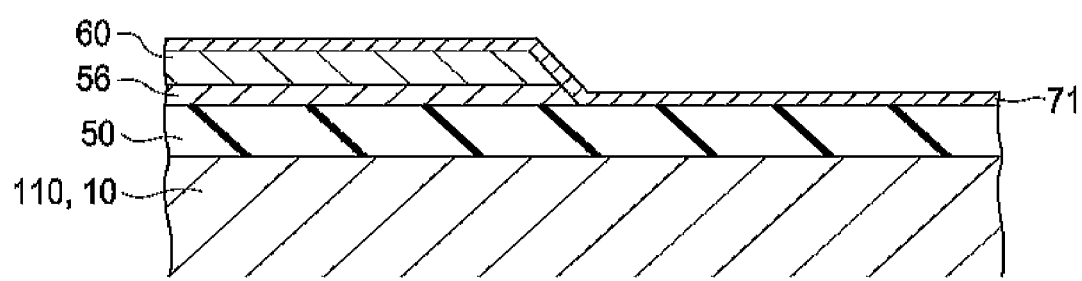

Both the oxide portion 65 and the piezoelectric layer 70 may be formed by a series of operations using a chemical solution method, such as MOD or a sol-gel method. More specifically, the oxide portion 65 and the piezoelectric layer 70 are formed by a series of operations as below. First, as shown in FIG. 5C, a sol or MOD solution (precursor solution) containing metal complexes each containing Bi, Fe, Mn, Ti or Ba in a desired proportion is applied onto the first electrode 60 by spin coating or the like to form a piezoelectric precursor film 71 (coating).

The precursor solution to be applied is prepared by dissolving or dispersing in an organic solution a mixture of metal complexes that can produce a complex oxide containing Bi, Fe, Mn, Ba and Ti. The mixture of metal complexes contains metal complexes each containing at least one of the metals constituting the complex oxide, and the metal complexes are mixed so that Fe, Mn, Ti and Ba have desired mole ratios while the mole ratio of Bi is 10 mol % or more higher than the mole ratio of the desired composition. More specifically, the metal complexes each containing Bi, Fe, Mn, Ba or Ti are mixed in such a proportion as metals Fe, Mn, Ti and Ba can form a complex oxide expressed as a mixed crystal of desired bismuth ferrate manganate and barium titanate while the mole ratio of Bi is higher by 10 mol % or more, more preferably by 10 mol % to 30 mol %, than that of the Bi of the complex oxide.

Metal complexes containing Bi, Fe, Mn, Ba or Ta include metal alkoxides, organic acid salts, and β-diketone complexes. The metal complex containing Bi may be bismuth 2-ethylhexanoate or bismuth acetate. The metal complex containing Fe may be iron 2-ethylhexanoate or iron acetate. The metal complex containing Mn may be manganese 2-ethylhexanoate or manganese acetate. Examples of the metal complex containing Ba include barium isopropoxide, barium 2-ethylhexanoate, and barium acetylacetonate. Examples of the metal complex containing Ti include titanium isopropoxide, titanium 2-ethylhexanoate, and titanium diisopropoxide bis(acetylacetonate). Metal complexes containing two or more metals of Bi, Fe, Mn, Ba and Ti may be used.

The solvent can be selected from various types of solvents that can dissolve or disperse the mixture of the metal complexes, such as toluene, xylene, octane, ethylene glycol, 2-methoxyphenol, butanol, ethanol, isopropyl alcohol, acetic acid, and water, without particular limitation. These solvents may be used in combination.

Subsequently, the piezoelectric precursor film 71 is dried for a certain time by being heated to a predetermined temperature (for example, 130 to 200° C.) (drying). Then, the dried piezoelectric precursor film 71 is degreased by being heated to a predetermined temperature (for example, 350 to 450° C.) and allowed to stand at that temperature for a certain time (degreasing). The degreasing mentioned herein is performed to convert organic components in the piezoelectric precursor film 71 into, for example, $NO_2$, $CO_2$ or $H_2O$ and thus to remove the organic components. The drying and degreasing may be performed in any atmosphere without particular limitation, and may be performed in the air, an oxygen atmosphere or an inert gas atmosphere. The operations for coating, drying and degreasing may be repeated.

Figure 6A:
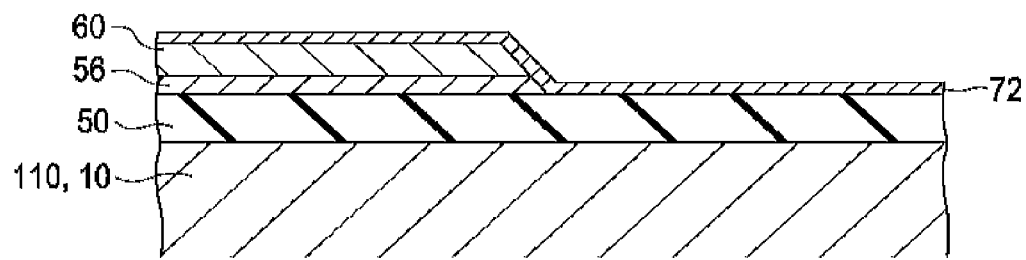
FIGS. 6A to 6C are sectional views showing the manufacturing process of the recording head according to the embodiment.

Then, as shown in FIG. 6A, the piezoelectric precursor film 71 is crystallized by being heated to a predetermined temperature, such as a temperature of about 600 to 850° C., and allowed to stand at that temperature for a certain time, such as for 1 to 10 minutes. Thus a piezoelectric film 72 is formed which is made of a piezoelectric material containing a complex oxide expressed as a mixed crystal of bismuth ferrate manganate and barium titanate (firing). The firing operation may be performed in any atmosphere without particular limitation, and may be performed in the air, an oxygen atmosphere or an inert gas atmosphere.

The heating apparatus used for the drying, degreasing and firing operations may be a rapid thermal annealing (RTA) apparatus using an infrared lamp for heating, or a hot plate.

Figure 6B:
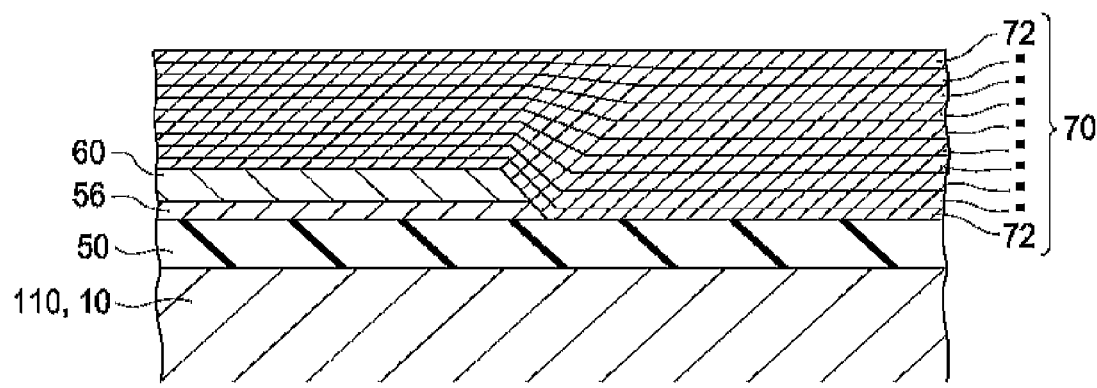
Figure 6C:
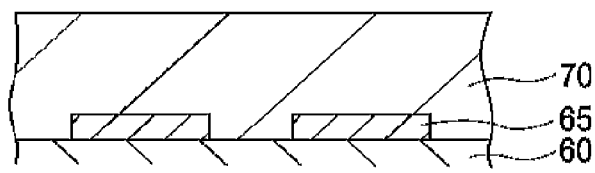

The operations of coating, drying and degreasing, or the operations of coating, drying, degreasing and firing are repeated according to the desired thickness, thus forming a plurality of piezoelectric films 72. Thus, the piezoelectric layer 70 has a predetermined thickness, including the piezoelectric films 72, as shown in FIG. 6B, with oxide portions 65 at the interface of the piezoelectric layer 70 with the first electrode 60, as shown in FIG. 6C, which is a fragmentary enlarged view of the major portion of FIG. 6B. For forming the piezoelectric films 72, the operations of coating, drying, degreasing and firing may be performed step by step, or the firing operation may be performed at one time after the sequence of operations of coating, drying and degreasing has been repeated. Although piezoelectric films 72 are formed on top of one another in the present embodiment, the piezoelectric layer 70 may include only a single piezoelectric film 72 in another embodiment.

Figure 7A:
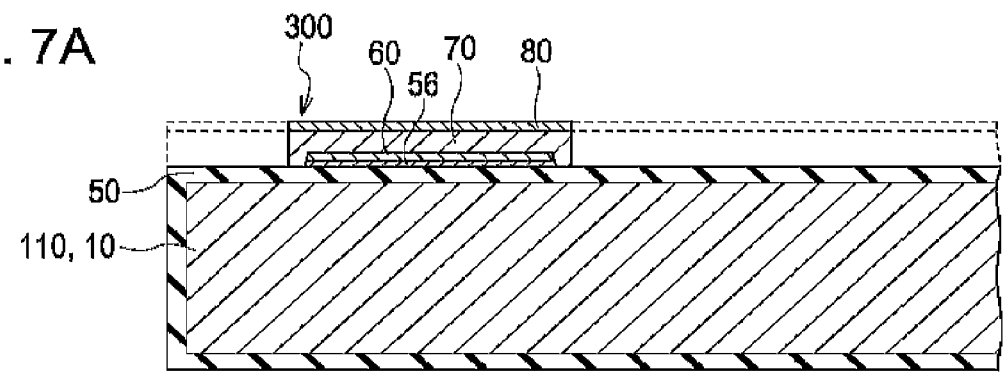
FIGS. 7A to 7C are sectional views showing the manufacturing process of the recording head according to the embodiment.

After the piezoelectric layer 70 is formed, a layer for second electrodes 80 is formed of platinum on the piezoelectric layer 70 by sputtering or the like, and the piezoelectric layer 70 and the layer for the second electrodes 80 are simultaneously patterned so as to form piezoelectric elements 300, each including the first electrode 60, the piezoelectric layer 70 and the second electrode 80, in regions corresponding to the pressure generating chambers 12, as shown in FIG. 7A. The patterning of the piezoelectric layer 70 and the second electrode 80 can be performed at one time by dry etching through a resist layer (not shown) having a predetermined shape. After this operation, post-annealing may be performed at a temperature in the range of 600 to 800° C., if necessary. Thus, favorable interfaces can be formed between the piezoelectric layer 70 and the first electrode 60 and between the piezoelectric layer 70 and the second electrode 80, and, in addition, the crystallinity of the piezoelectric layer 70 can be enhanced.

Figure 7B:
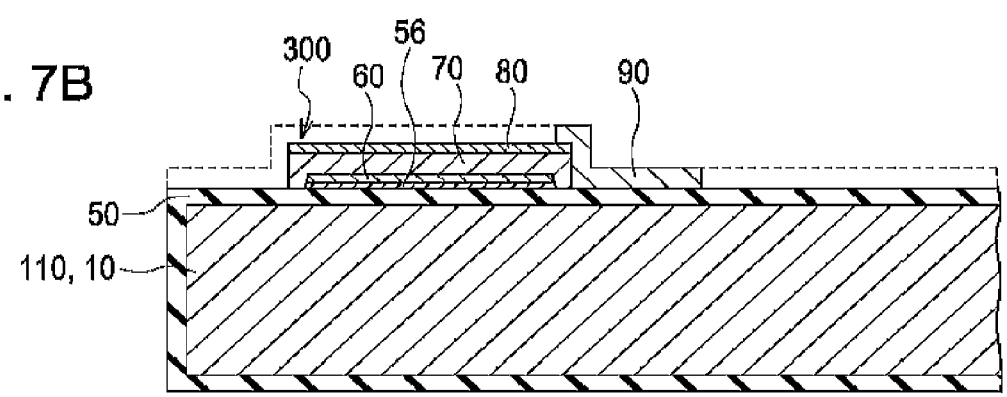

Then, a film is formed of, for example, gold (Au), over the entire surface of the flow channel substrate wafer 110, and is patterned into lead electrodes 90 for each piezoelectric element 300, as shown in FIG. 7B, through a mask pattern (not shown) made of, for example, resist.

Figure 7C:
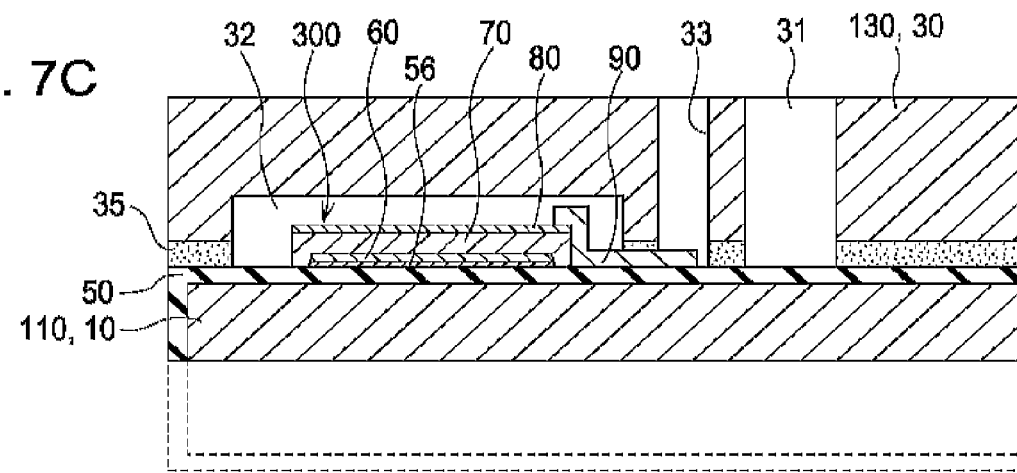

Then, a silicon protective substrate wafer 130 for a plurality of protective substrates 30 is bonded to the piezoelectric element 300 side of the flow channel substrate wafer 110 with an adhesive 35, and the thickness of the flow channel substrate wafer 110 is reduced to a predetermined level, as shown in FIG. 7C.

Figure 8A:
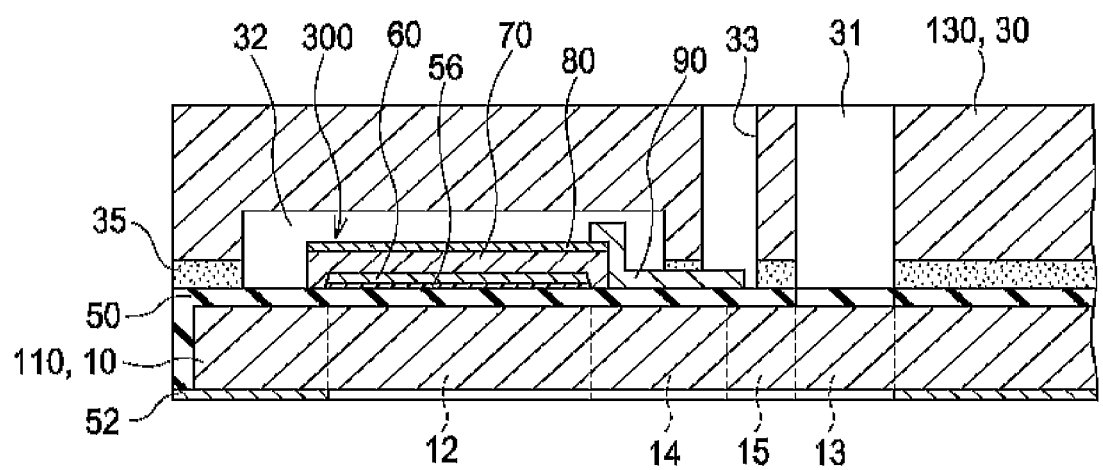
FIGS. 8A and 8B are sectional views showing the manufacturing process of the recording head according to the embodiment.

Turning to FIG. 8A, a mask layer is formed on the surface of the flow channel substrate wafer 110 opposite to the protective substrate wafer 130 and is patterned into a mask 52 having a predetermined shape.

Figure 8B:
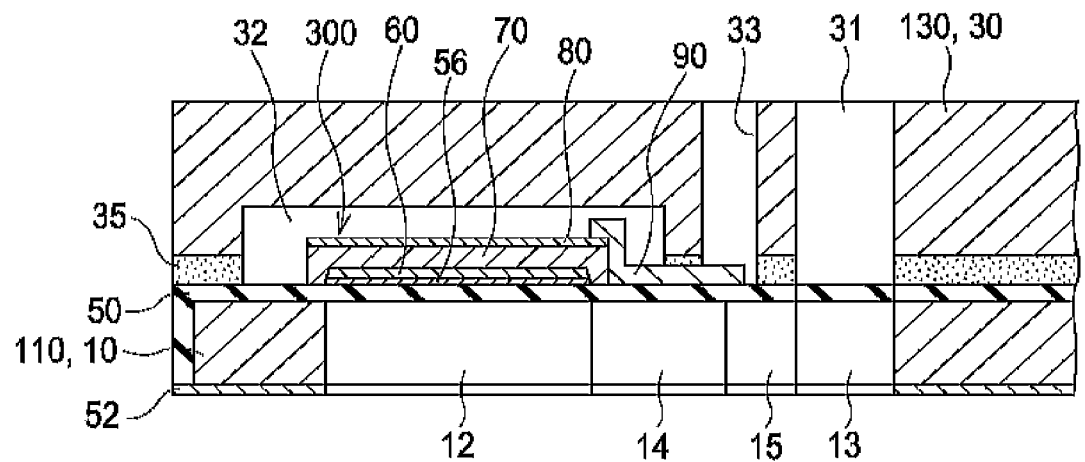

Subsequently, as shown in FIG. 8B, the flow channel substrate wafer 110 is subjected to anisotropic etching (wet etching) using an alkaline solution, such as KOH, through the mask 52 to form the pressure generating chambers 12 corresponding to the piezoelectric elements 300, the communicating section 13, the ink supply channels 14 and the communication paths 15 therein.

Then, unnecessary outer portions of the flow channel substrate wafer 110 and protective substrate wafer 130 are cut off by, for example, dicing. Subsequently, a nozzle plate 20 having nozzle apertures 21 therein is joined to the surface of the flow channel substrate wafer 110 opposite the protective substrate wafer 130 after the mask 52 has been removed, and a compliance substrate 40 is joined to the protective substrate wafer 130. The flow channel substrate wafer 110 joined to other substrates is cut into chips as shown in FIG. 1, each including a flow channel substrate 10 and other members. Thus, the ink jet recording head I of the present embodiment is completed.

The invention will be further described in detail with reference to Examples below. However, the invention is not limited to the following Examples.

Examples 1 to 4, Comparative Examples 1 and 2

First, a silicon dioxide film was formed to a thickness of 1200 nm on a (110)-oriented monocrystalline silicon substrate by thermal oxidation. Subsequently, a titanium film was formed to a thickness of 40 nm on the silicon dioxide film by RF magnetron sputtering, and was then oxidized to form a titanium oxide film. Then, a platinum film was formed to a thickness of 100 nm on the titanium oxide film by RF magnetron sputtering, thus forming a (111)-oriented first electrode 60.

A precursor solution was prepared by mixing bismuth 2-ethylhexanoate, iron acetylacetonate, barium acetate, titanium isopropoxide and manganese acetylacetonate in n-butanol so that each metal was in the proportion shown in Table 1.

The precursor solution was dropped onto the surface of the substrate on which the titanium oxide film and the first electrode 60 had been formed, and was then subjected to spin coating at a speed of 3000 rpm, thus forming a piezoelectric precursor film (coating). Then, the piezoelectric precursor film on the substrate was dried on a hot plate at 180° C. for 2 minutes (drying). The piezoelectric precursor film was further subjected to degreasing on a hot plate at 450° C. for 2 minutes (degreasing). The sequence of the operations of coating, drying and degreasing was performed twice, and, then, the resulting precursor films were fired at 750° C. for 5 minutes in an oxygen atmosphere using a rapid thermal annealing (RTA) apparatus (firing).

Subsequently, a sequence of performing the sequence of the operations of coating, drying and degreasing four times and, subsequently, the operation of firing all the precursor films was performed twice. Thus, a piezoelectric layer 70 was formed to a thickness of 660 nm by 10 coating operations in total.

Then, a platinum film having a diameter of 500 μm and a thickness of 100 nm was formed as second electrodes 80 on the piezoelectric layer 70 by DC sputtering, and was then fired at 750° C. for 5 minutes by RTA to complete a piezoelectric element.

TABLE 1

| | Excess of Bi | Bi Mole ratio | Ba Mole ratio | Fe Mole ratio | Ti Mole ratio | Mn Mole ratio |
|---|---|---|---|---|---|---|
| Example 1 | 10 mol % | 0.7500 | 0.2500 | 0.7125 | 0.2500 | 0.0375 |
| Example 2 | 12 mol % | 0.8100 | 0.2500 | 0.7125 | 0.2500 | 0.0375 |
| Example 3 | 14 mol % | 0.8250 | 0.2500 | 0.7125 | 0.2500 | 0.0375 |
| Example 4 | 16 mol % | 0.8400 | 0.2500 | 0.7125 | 0.2500 | 0.0375 |
| Comparative Example 1 | 0 mol % | 0.8550 | 0.2500 | 0.7125 | 0.2500 | 0.0375 |
| Comparative Example 2 | 8 mol % | 0.8700 | 0.2500 | 0.7125 | 0.2500 | 0.0375 |

Examination 1

Figure 9:
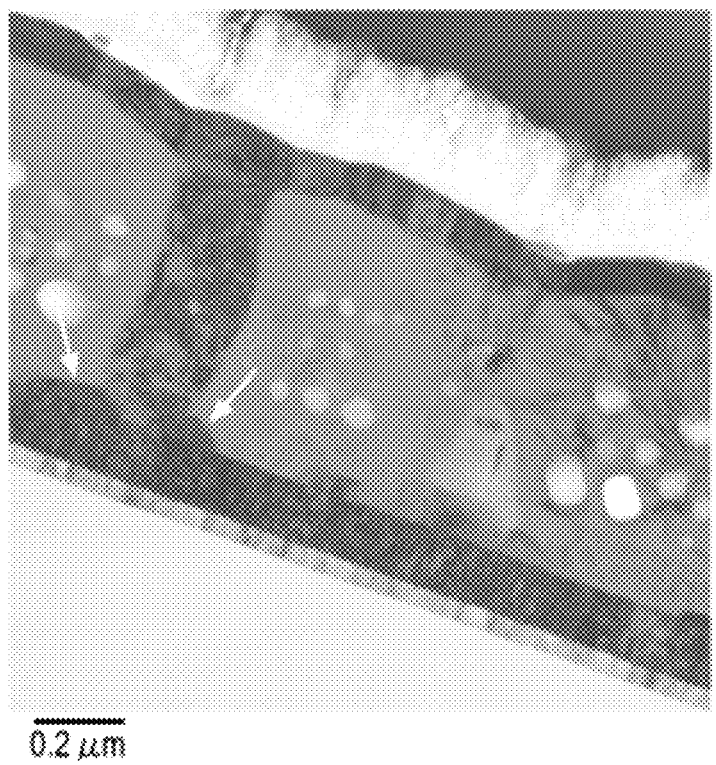
FIG. 9 is an EFTEM-BF image of a piezoelectric element of Example 1.

The section along the thickness direction of the piezoelectric element of Example 1 was observed through an EFTEM (energy-filtering transmission electron microscope). The EFTEM-BF (Bright Field) image obtained is shown in FIG. 9. Also, FIG. 10 shows an enlargement of a part of FIG. 9.

Figure 10:
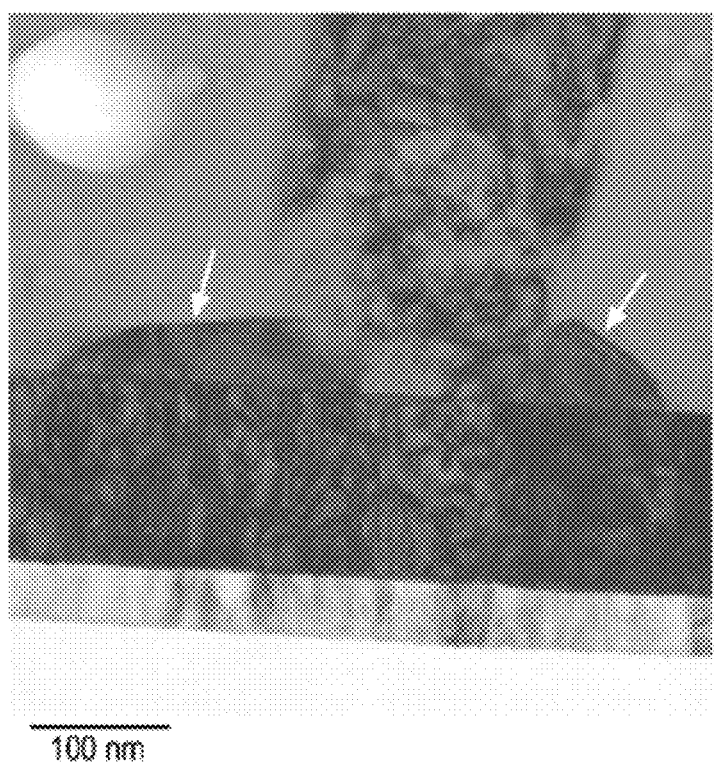
FIG. 10 is an enlarged EFTEM-BF image of the piezoelectric element of Example 1.
Figure 11:
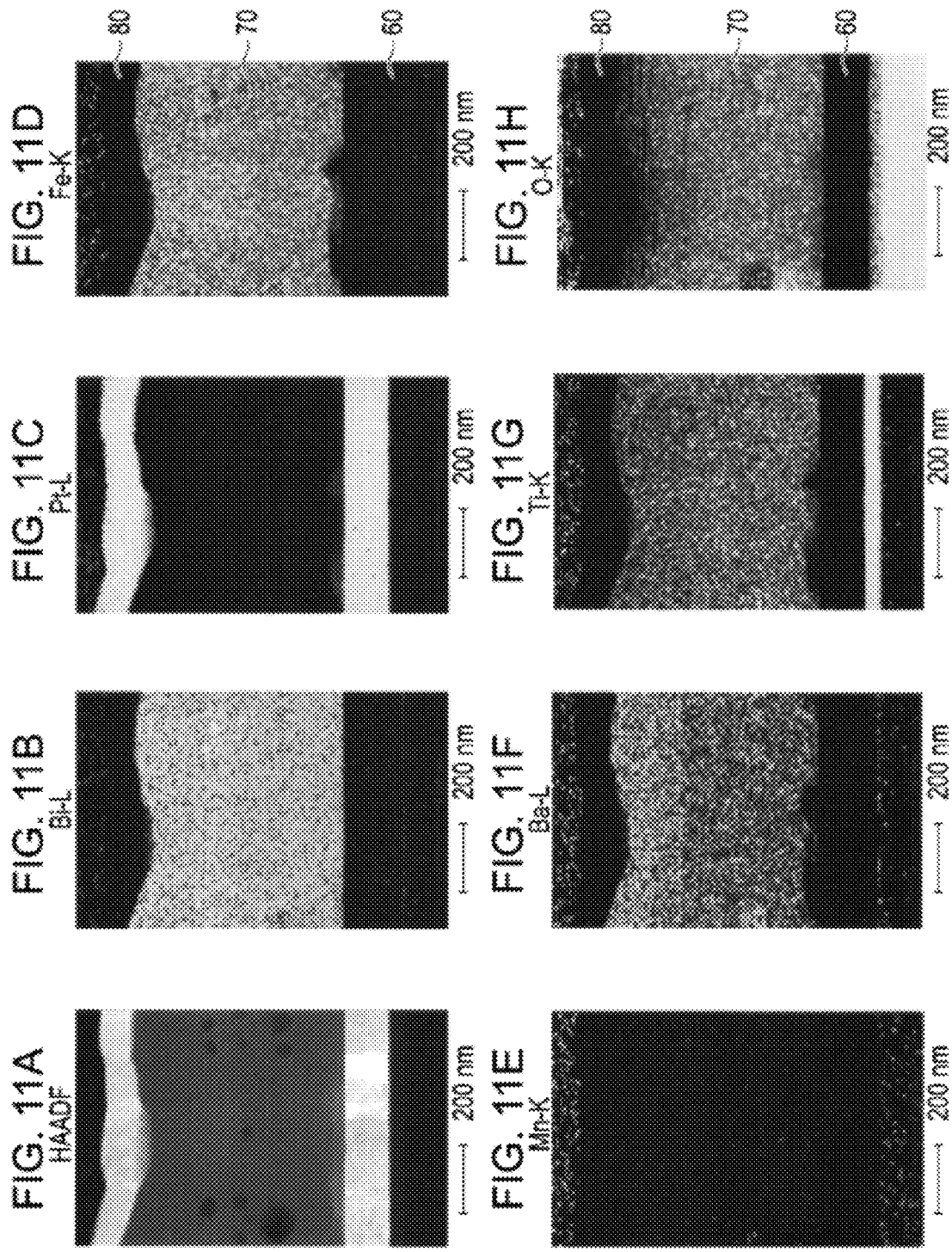
FIGS. 11A to 11H are STEM-EDS map images of the piezoelectric element of Example 1.

As a result, it was found that oxide portions 65 having thicknesses of about 60 nm were formed between the piezoelectric layer 70 and the first electrode 60, as shown in FIGS. 9 and 10 (see portions indicated by arrows). The oxide portions 65 were formed in an island manner on the first electrode 60. The oxide portions 65 were formed at the interface of the piezoelectric layer 70 with the first electrode 60, but were not formed in the middle in the thickness direction or on the second electrode 80 side of the piezoelectric layer 70.

Examination 2

The scanning electron microscopy high-angle annular dark field (STEM-HAADF) and the Bi, Pt, Fe, Mn, Ba, Ti and O of the piezoelectric element of Example 1 were observed at a section along the thickness direction of the piezoelectric element by scanning transmission electron microscope-energy-dispersive spectroscopy (STEM-EDS). For the Bi, Pt and Ba, their L shells were observed. For the Fe, Mn, Ti and O, their K shells were observed. The results are shown in FIGS. 11A to 11H. As shown in these figures, the oxide portion 65 contained Pt, Bi and O. The piezoelectric layer 70 contained Bi, Fe, Mn, Ba, Ti and O.

Examination 3

Figure 12:
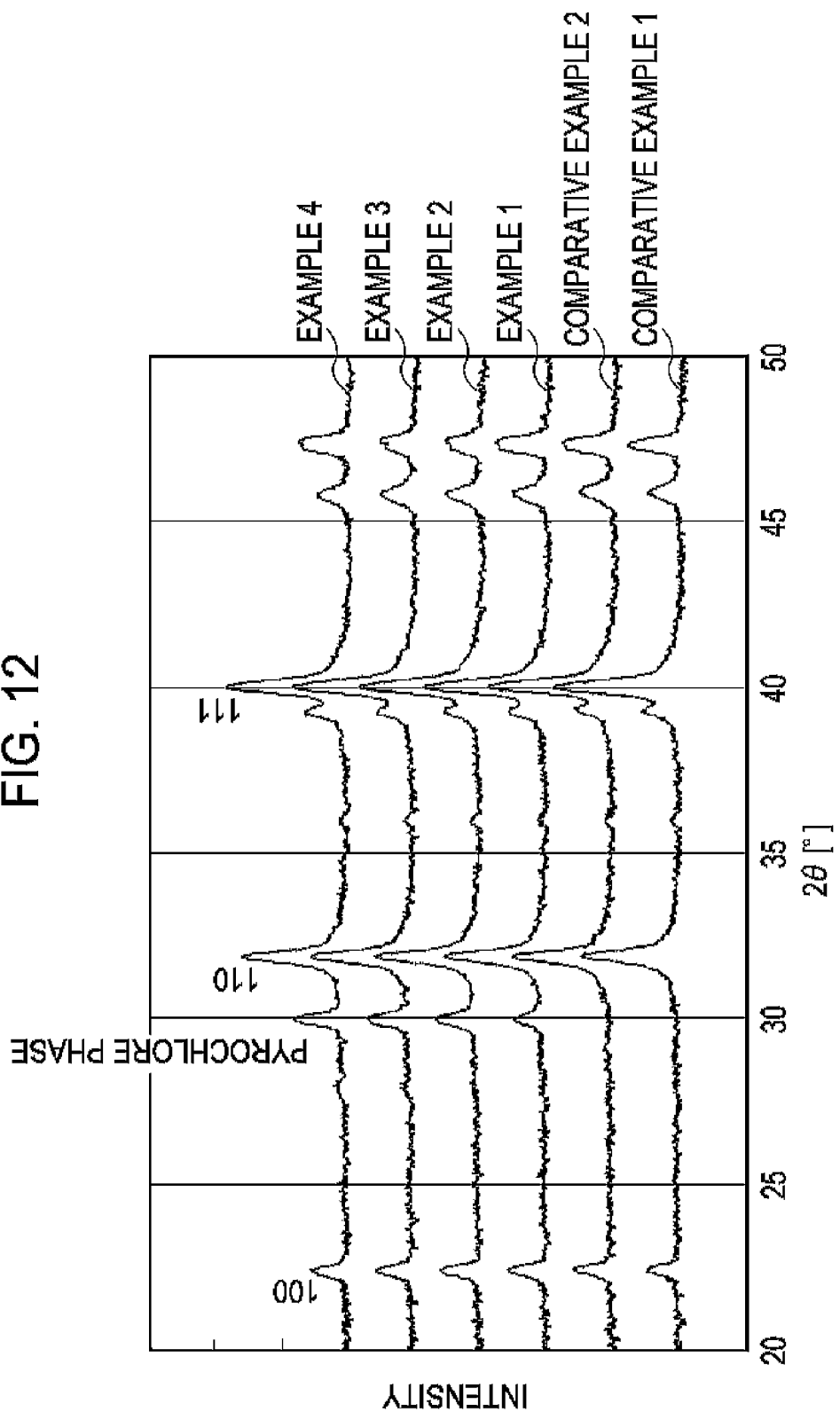
FIG. 12 is a plot of the X-ray diffraction patterns of Examples 1 to 4 and Comparative Examples 1 and 2.

The piezoelectric elements of Examples 1 to 4 and Comparative Examples 1 and 2 were subjected to powder X-ray diffraction analysis to obtain the diffraction pattern of the piezoelectric layer with D8 Discover (manufactured by Bruker AXS) using CuKα rays at room temperature. The results are shown in FIG. 12.

In all of Examples 1 to 4 and Comparative Examples 1 and 2, a peak representing a perovskite structure and a peak representing the substrate were observed. More specifically, a peak representing (100) orientation of the piezoelectric layer made of a single phase of a perovskite structure was observed around 23°, a peak representing (110) orientation of the silicon substrate was observed around 32°, and a peak representing (111) orientation of Pt was observed around 40°.

In addition, in Examples 1 to 4, a peak derived from a pyrochlore structure was observed around 30°. On the other hand, in Comparative Examples 1 and 2, the peak derived from a pyrochlore structure was not observed.

The results of Examinations 1 to 3 show that oxide portions 65 made of bismuth platinate having a pyrochlore structure were formed at the interface of the piezoelectric layer 70 with the first electrode 60 in Examples 1 to 4, in which the mole ratio of Bi was adjusted so as to be 10 mol % or more higher than the mole ratio of a desired composition.

Examination 4

Figure 13:
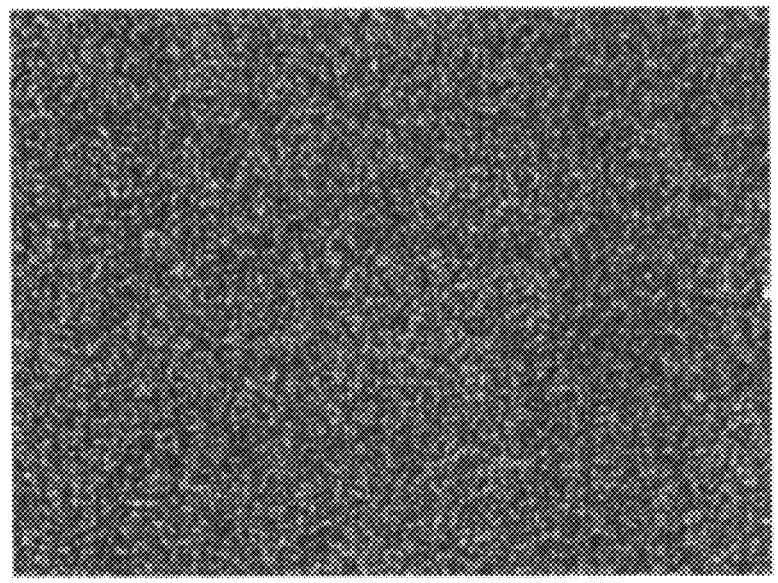
FIG. 13 is a metallurgical micrograph of the surface of the piezoelectric layer of Example 1.
Figure 14:
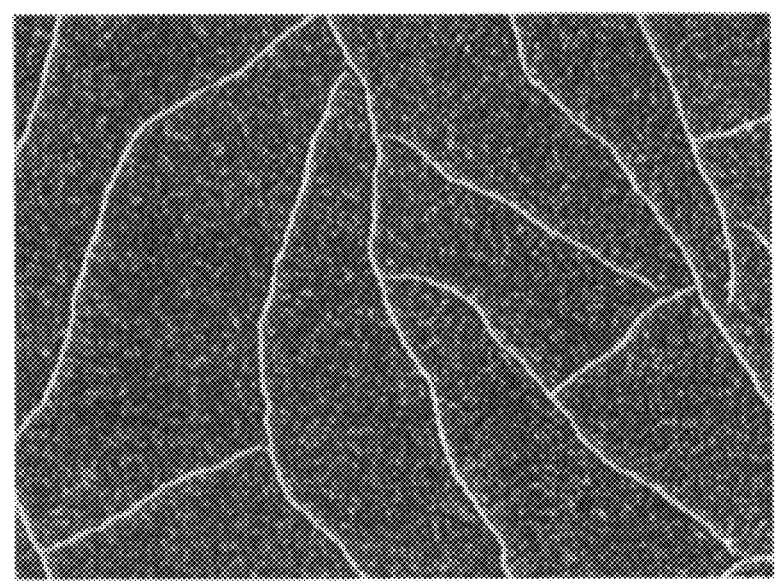
FIG. 14 is a metallurgical micrograph of the surface of the piezoelectric layer of Comparative Example 1.

It was observed for 7 days after the formation of the piezoelectric layer 70 whether or not the piezoelectric layer 70, not having the second electrode 80, was cracked, for Examples 1 to 4 and Comparative Examples 1 and 2. It was determined that samples not cracked were good, and that samples cracked were bad. The results are shown in Table 2. The surface of the piezoelectric layer 70 after one day had elapsed from its formation was observed at a magnification of 1000 times through a metallurgical micrograph in a dark field mode, for Example 1 and Comparative Example 1. The result of Example 1 is shown in FIG. 13, and the result of Comparative Example 1 is shown in FIG. 14.

In Examples 1 to 4 in which oxide portions 65 made of bismuth platinate having a pyrochlore structure were formed at the interface of the piezoelectric layer 70 with the first electrode 60, cracks were not observed. On the other hand, in Comparative Examples 1 and 2 in which oxide portions 65 made of bismuth platinate having a pyrochlore structure were not formed at the interface of the piezoelectric layer 70 with the first electrode 60, cracks were observed after 24 hours had elapsed.

TABLE 2

| | Excess of Bi | After one hour | After 24 hours | After 7 days |
|---|---|---|---|---|
| Example 1 | 10 mol % | Good | Good | Good |
| Example 2 | 12 mol % | Good | Good | Good |
| Example 3 | 14 mol % | Good | Good | Good |
| Example 4 | 16 mol % | Good | Good | Good |
| Comparative Example 1 | 0 mol % | Good | Bad | Bad |
| Comparative Example 2 | 8 mol % | Good | Bad | Bad |

Other Embodiments

Although an exemplary embodiment of the invention has been described, the invention is not limited to the disclosed embodiment. For example, in the above embodiment, a monocrystalline silicon substrate is used as the flow channel substrate 10. However, the flow channel substrate 10 may be made of, for example, silicon-on-insulator (SOI) or glass, without particular limitation.

Also, although the piezoelectric element 300 of the above embodiment includes the first electrode 60, the piezoelectric layer 70 and the second electrode 80 that are stacked in that order on a substrate (flow channel substrate 10), the structure of the piezoelectric element is not limited to this structure. For example, an embodiment of the invention can be applied to a vertical vibration piezoelectric element including layers of a piezoelectric material and an electrode material alternately formed so as to expand and contract in the axis direction.

Figure 15:
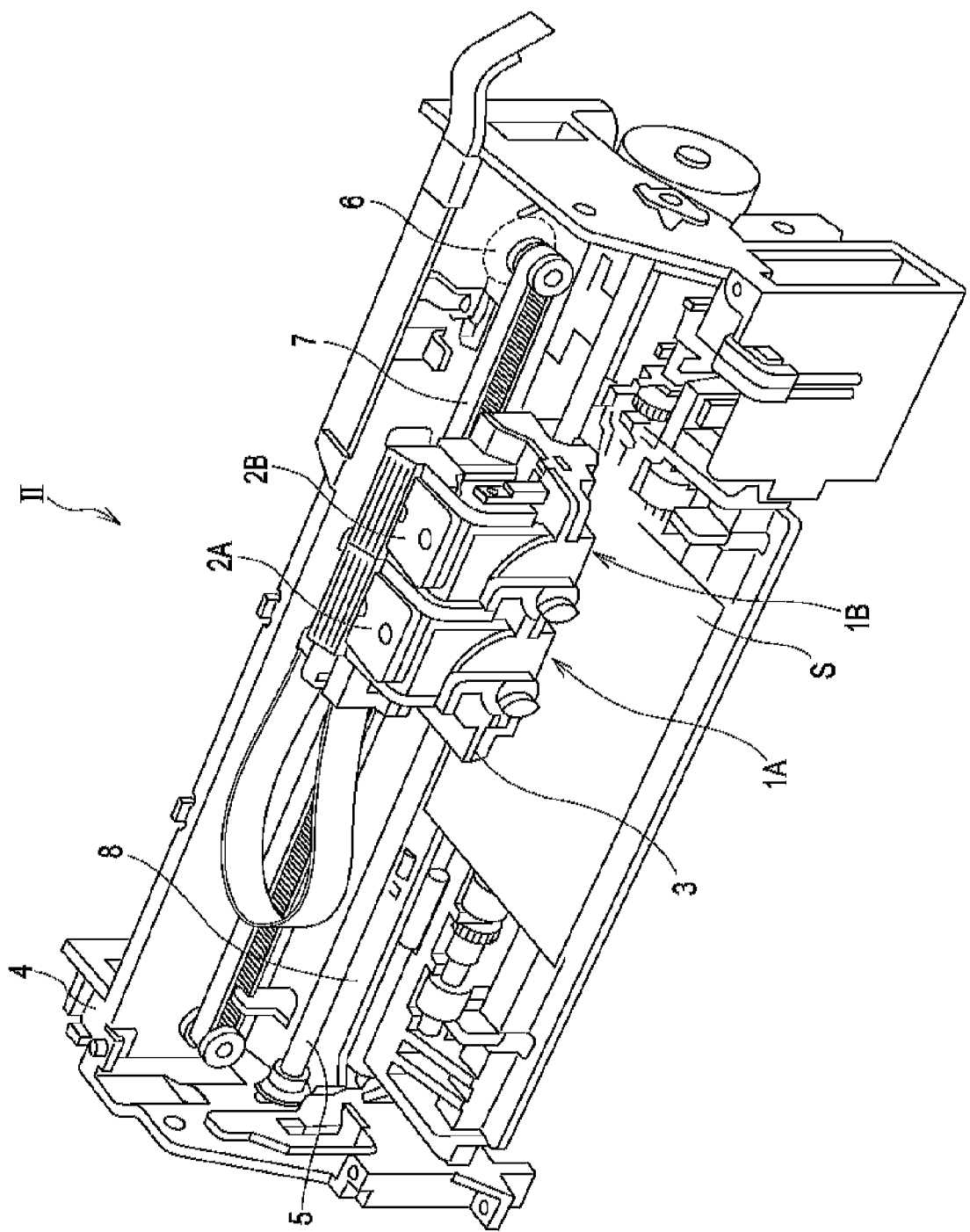
FIG. 15 is a schematic view of a recording apparatus according to an embodiment of the invention.

The ink jet recording head according to an embodiment of the invention can be installed in an ink jet recording apparatus to serve as a part of a recording head unit including flow channels communicating with an ink cartridge or the like. FIG. 15 is a schematic perspective view of such an ink jet recording apparatus.

The ink jet recording apparatus II shown in FIG. 15 includes recording head units 1A and 1B each including the ink jet recording head I, and cartridges 2A and 2B for supplying ink are removably mounted in the respective recoding head units 1A and 1B. The recording head units 1A and 1B are loaded on a carriage 3 secured for movement along a carriage shaft 5 of an apparatus body 4. The recording head units 1A and 1B eject, for example, a black ink composition and a color ink composition, respectively.

The carriage 3 on which the recording head units 1A and 1B are mounted is moved along the carriage shaft 5 by transmitting a driving force from a driving motor 6 to the carriage 3 through a plurality of gears (not shown) and a timing belt 7. In the apparatus body 4, a platen 8 is disposed along the carriage shaft 5 so that a recording sheet S, which is a print medium such as a paper sheet, fed from, for example, a feed roller (not shown), is transported over the platen 8.

Although the above embodiment has described an ink jet recording head as the liquid ejecting head, the invention is intended for any type of liquid ejecting head, and may be applied to other liquid ejecting heads that eject liquid other than ink. Other liquid ejecting heads include various types of recording head used in image recording apparatuses such as printers, color material ejecting heads used for manufacturing color filters of liquid crystal displays or the like, electrode material ejecting heads used for forming electrodes of organic EL displays or field emission displays (FEDs), and bioorganic material ejecting heads used for manufacturing biochips.

The piezoelectric element of embodiments of the invention can be used in ultrasonic oscillators and other ultrasonic wave devices, ultrasonic motors, IR sensors, ultrasonic sensors, thermal sensors, pressure sensors, pyroelectric sensors, acceleration sensors, gyroscopic sensors, and other sensors, without being limited to the piezoelectric element used in liquid ejecting heads represented by an ink jet recording head. Furthermore, the invention can be applied to ferroelectric memory devices and other ferroelectric elements, liquid micropumps, thin-film ceramic capacitors, gate insulating films and so forth.

What is claimed is:

1. A piezoelectric element comprising:
   a first electrode including platinum;
   a piezoelectric layer disposed above the first electrode, the piezoelectric layer being made of a complex oxide having a perovskite structure containing at least bismuth; and
   a second electrode disposed above the piezoelectric layer, wherein another oxide containing bismuth and platinum is disposed at the interface of the piezoelectric layer with the first electrode, the another oxide containing bismuth and platinum being formed at an interface between the first electrode and the piezoelectric layer as a plurality of spaced apart islands.

2. The piezoelectric element according to claim 1, wherein the piezoelectric layer further contains iron.

3. The piezoelectric element according to claim 2, wherein the piezoelectric layer further contains manganese and titanium.

4. The piezoelectric element according to claim 1, wherein the oxide containing bismuth and platinum is bismuth platinate having a pyrochlore structure.

5. A liquid ejecting head comprising the piezoelectric element as set forth in claim 1.

6. A liquid ejecting apparatus comprising the liquid ejecting head as set forth in claim 5.

* * * * *